United States Patent
Choi et al.

(10) Patent No.: US 8,941,225 B2
(45) Date of Patent: Jan. 27, 2015

(54) INTEGRATED CIRCUIT PACKAGE AND METHOD FOR MANUFACTURING THE SAME

(71) Applicant: STS Semiconductor & Telecommunications Co., Ltd., Cheonan-si, Chungcheongnam-do (KR)

(72) Inventors: Daesik Choi, Seoul (KR); Seung Hoon Oh, Cheonan-si (KR)

(73) Assignee: STS Semiconductor & Telecommunications Co., Ltd., Cheonan-si, Chungcheongnam-do (KR)

( * ) Notice: Subject to any disclaimer, the term of this patent is extended or adjusted under 35 U.S.C. 154(b) by 0 days.

(21) Appl. No.: 13/932,930

(22) Filed: Jul. 1, 2013

(65) Prior Publication Data

US 2014/0312481 A1    Oct. 23, 2014

(30) Foreign Application Priority Data

Apr. 18, 2013    (KR) ......................... 10-2013-0042906

(51) Int. Cl.
| | |
|---|---|
| H01L 23/02 | (2006.01) |
| H01L 23/22 | (2006.01) |
| H01L 23/10 | (2006.01) |
| H01L 21/44 | (2006.01) |
| H01L 21/50 | (2006.01) |
| H01L 25/065 | (2006.01) |
| H01L 25/00 | (2006.01) |

(52) U.S. Cl.
CPC ............ H01L 25/0657 (2013.01); H01L 25/50 (2013.01)
USPC ........... 257/686; 257/687; 257/690; 257/707; 257/723; 257/787; 438/107; 438/109; 438/127

(58) Field of Classification Search
CPC . H01L 21/563; H01L 21/565; H01L 23/3107; H01L 23/3121; H01L 23/3128; H01L 23/315; H01L 23/5389; H01L 2224/73265; H01L 2924/15311; H01L 2224/97; H01L 2224/73204; H01L 2224/4824; H01L 2224/32145; H01L 24/81; H01L 24/97; H01L 2224/81; H01L 2224/16237; H01L 2225/1058
USPC ................. 438/106–110, 118, 127, 612–615; 257/678, 684–687, 690, 707, 723–725, 257/734–738, 778, 780–784, 787–792
See application file for complete search history.

(56) References Cited

U.S. PATENT DOCUMENTS

| | | | |
|---|---|---|---|
| 2009/0166834 A1* | 7/2009 | Yoon et al. ..................... | 257/686 |
| 2011/0127662 A1* | 6/2011 | Yang et al. ..................... | 257/686 |
| 2013/0075927 A1* | 3/2013 | Chi et al. ........................ | 257/774 |
| 2013/0127054 A1* | 5/2013 | Muthukumar et al. ........ | 257/738 |

* cited by examiner

*Primary Examiner* — Hsien Ming Lee
(74) *Attorney, Agent, or Firm* — Novick, Kim & Lee, PLLC; Jae Youn Kim

(57) ABSTRACT

A stacked integrated circuit package and a method for manufacturing the same are provided. The stacked integrated circuit package includes a first integrated circuit package comprising a first substrate, a first semiconductor chip, and a first molding portion, an interposer mounted on the first substrate to be electrically connected to the circuit pattern of the first substrate by a first solder bump, the interposer being provided with an opening to accommodate the first semiconductor chip, and a second integrated circuit package stacked on the first integrated circuit package and the interposer and electrically connected to the interposer by a second solder bump, the second integrated circuit package comprising a second substrate, a second semiconductor chip, and a second molding portion.

10 Claims, 5 Drawing Sheets

PRIOR ART

PRIOR ART

INTEGRATED CIRCUIT PACKAGE AND METHOD FOR MANUFACTURING THE SAME

BACKGROUND OF THE INVENTION

1. Field of the Invention

The present invention relates to an integrated circuit package, and more particularly to a stacked integrated circuit package having a package-on-package structure and a method for manufacturing the same.

2. Description of the Related Art

In the semiconductor industry, a product having light weight, compact size, multi-functionality and high performance is generally demanded. One technology necessary to meet such demand is integrated circuit packaging.

Integrated circuit packaging is a technology of forming input/output signal terminals to a main board using a lead frame or a printed circuit board and molding the terminals with a encapsulant to protect a semiconductor chip such as a single device and an integrated circuit, formed by stacking electric circuits and wires, from various external environmental factors such as dust, moisture, and electric and mechanical loads and to optimize or maximize electrical performance of the semiconductor chip.

As products having integrated circuit packages mounted therein have recently been made lightweight and slim and provided with compact side, and many functions are demanded of the products, System in Package (SIP) and Package on Package (POP) technologies, which allow a plurality of semiconductor chips to be mounted on an integrated circuit package, have entered into widespread use as integrated circuit packaging technology.

The number of I/O terminals increases with increase in capacity of an integrated circuit package. To increase the number of I/O terminals without causing increase of the entire size of the integrated circuit package, forming a through mold via (TMV) by providing a through hole to a mold portion and filling the through hole with conductive paste has been proposed.

FIGS. 1A to 1E are cross-sectional views illustrating the processes of manufacturing a conventional TMV-type stacked integrated circuit package. The method for manufacturing the conventional TMV-type stacked integrated circuit package is described below with reference to FIGS. 1A to 1E.

As shown in FIG. 1A, a substrate 10 provided with wire terminals 11, external terminals 12 and via contacts 13 electrically connecting the wire terminals 11 and the external terminals 12 is first prepared.

Next, as shown in FIG. 1B, the semiconductor chip 20 and solder balls 30 are attached to the substrate 10. At this time, the semiconductor chip 20 is connected to the wire terminals 11 on the substrate 10 via conductive bumps 22 in a flip chip bonding manner, with the circuit pattern 21 of the semiconductor chip 20 facing downward. In addition, the solder balls 30 are formed at the edge of the substrate 10.

Next, as shown in FIG. 1C, the space between the semiconductor chip 20 and the substrate 10 is filled with an underfill 41. Then, molding is performed on the entire upper surfaces of the semiconductor chip 20 and the substrate 10 using the encapsulant to form a molding portion 40.

Next, as shown in FIG. 1D, the molding portion 40 is subjected to etching through laser machining to form a via hole 50 such that a part of the solder ball 30 on the upper surface of the substrate 10 is exposed.

Next, as shown in FIG. 1E, an upper integrated circuit package 60 is stacked on the lower integrated circuit package which is formed through the processes shown in FIGS. 1A to 1D, and then solder balls are formed on the bottom surface of the substrate 10.

However, in the case on the conventional TMV-type stacked integrated circuit package described above, laser machining process for formation of a via hole takes a long time, and the number of I/O terminals is limited. Further, rewiring on the upper integrated circuit package is substantially impossible. Thereby, circuit design for the conventional TMV-type stacked integrated circuit package is difficult.

However, with increased demand for slim and lightweight design and simplicity of electronic appliances, efforts are continuously put forth to further reduce thickness and weight of an integrated circuit package.

SUMMARY OF THE INVENTION

Therefore, the present invention has been made in view of the above problems, and it is an object of the present invention to provide a stacked integrated circuit package which can substantially address various problems caused by limitations and disadvantages of the conventional technology and a method for manufacturing the same.

It is another object of the present invention to provide a stacked integrated circuit package which can address high temperature warpage of a through mold via (TMV)-type stacked integrated circuit package and a method for manufacturing the same.

It is another object of the present invention to provide a stacked integrated circuit package, which allows increase in the number of I/O terminals for a TMV-type stacked integrated circuit package and facilitates rewiring, and a method for manufacturing the same.

In accordance with an aspect of the present invention, the above and other objects can be accomplished by the provision of a stacked integrated circuit package including a first integrated circuit package comprising a first substrate provided with a circuit pattern, a first semiconductor chip mounted on the first substrate to be electrically connected to the circuit pattern, and a first molding portion formed such that at least one surface of the first semiconductor chip is exposed, an interposer mounted on the first substrate to be electrically connected to the circuit pattern of the first substrate by a first solder bump, the interposer being provided with an opening to accommodate the first semiconductor chip, and a second integrated circuit package stacked on the first integrated circuit package and the interposer and electrically connected to the interposer by a second solder bump, the second integrated circuit package comprising a second substrate provided with a circuit pattern, a second semiconductor chip mounted on the second substrate to be electrically connected to the circuit pattern, and a second molding portion formed to completely seal one surface of the second semiconductor chip and the second substrate.

At least one of the first semiconductor chip and the second semiconductor chip may be mounted on the first substrate or the second substrate through a flip chip boding structure.

At least one of the first semiconductor chip and the second semiconductor chip may be mounted on the first substrate or the second substrate through a wire bonding structure.

The interposer may be provided with a layer structure identical to a layer structure of at least one of the first substrate and the second substrate. The interposer may include an insulating substrate, a circuit pattern formed on each of an upper surface and a lower surface of the insulating substrate, and a via contact provided to electrically connect the circuit pattern on the upper surface to the circuit pattern on the lower surface.

The interposer may be provided with a lead frame or a layer structure allowing interconnection.

In accordance with another aspect of the present invention, there is provided a method for manufacturing a stacked integrated circuit package comprising the steps of mounting a first semiconductor chip on a first substrate provided with a circuit pattern, mounting an interposer on the first substrate, the interposer being provided with an opening to accommodate the first semiconductor chip, filling a space between the first substrate and the first semiconductor chip, between the first substrate and the interposer and between the first semiconductor chip and the interposer with an encapsulant such that at least one surface of the first substrate is exposed, and stacking, on the first semiconductor chip, an integrated circuit package including a second substrate and a second semiconductor chip mounted on the second substrate the second semiconductor chip, such that the second semiconductor chip is electrically connected to the first semiconductor chip via the interposer.

At least one of the first semiconductor chip and the second semiconductor chip may be mounted on the first substrate or the second substrate in a flip chip bonding process.

At least one of the first semiconductor chip and the second semiconductor chip may be mounted on the first substrate or the second substrate in a wire bonding process.

The step of filling may include a film assisted molding (FAM) process.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Reference will now be made in detail to the embodiments of the present invention, examples of which are illustrated in the accompanying drawings.

In describing the present invention, a detailed description of well-known functions and constituents will be omitted if such description might unnecessarily obscure the main points of the present invention. In addition, terms which will be used below are defined in consideration of the functions of the present invention. The definitions of the terms may vary depending on intention of a user or a precedent case. Therefore, the terms should be defined based on the entire specification.

Figure 1A:
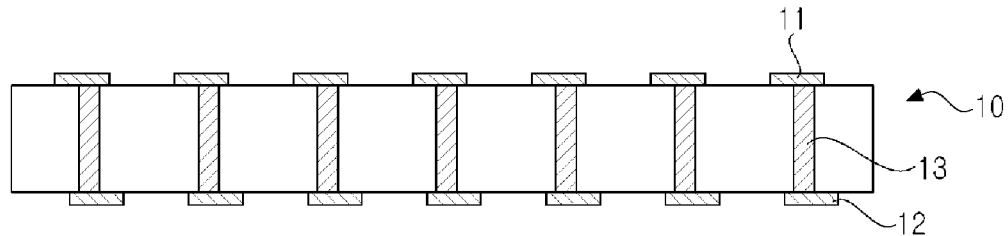
FIGS. 1A to 1E are cross-sectional views illustrating the processes of manufacturing a conventional TMV-type stacked integrated circuit package.
Figure 1B:
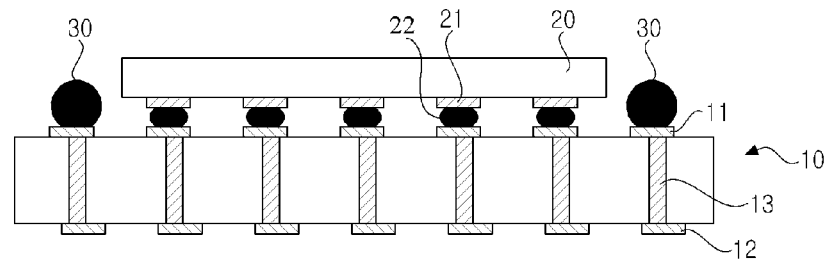
Figure 1C:
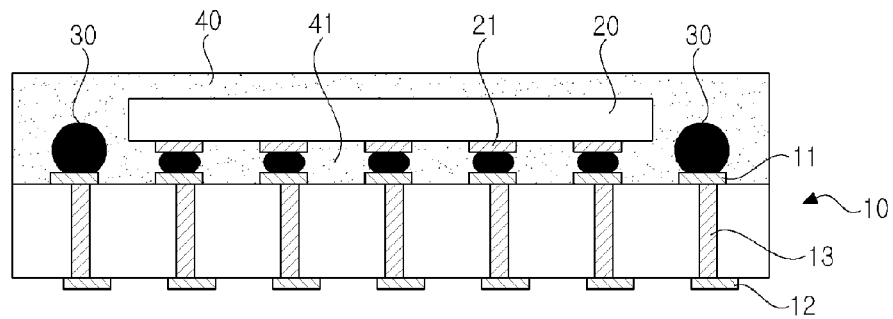
Figure 1D:
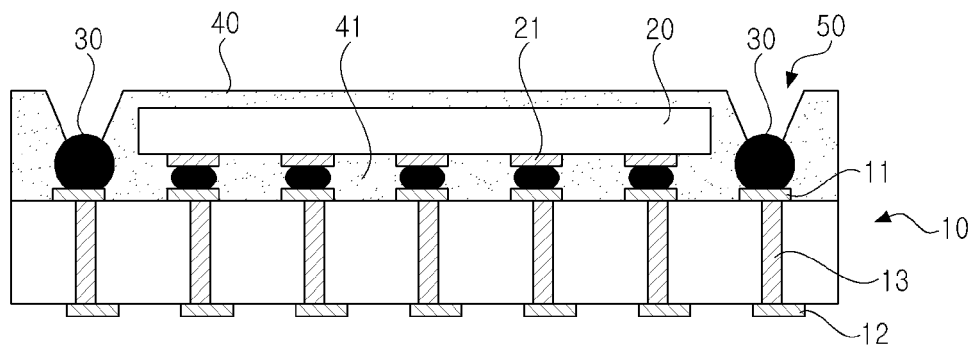
Figure 1E:
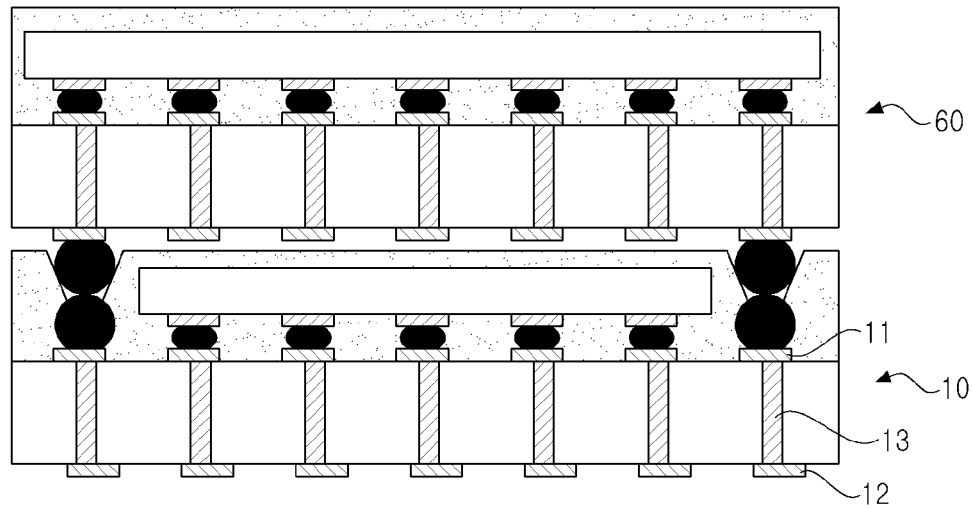
Figure 2:
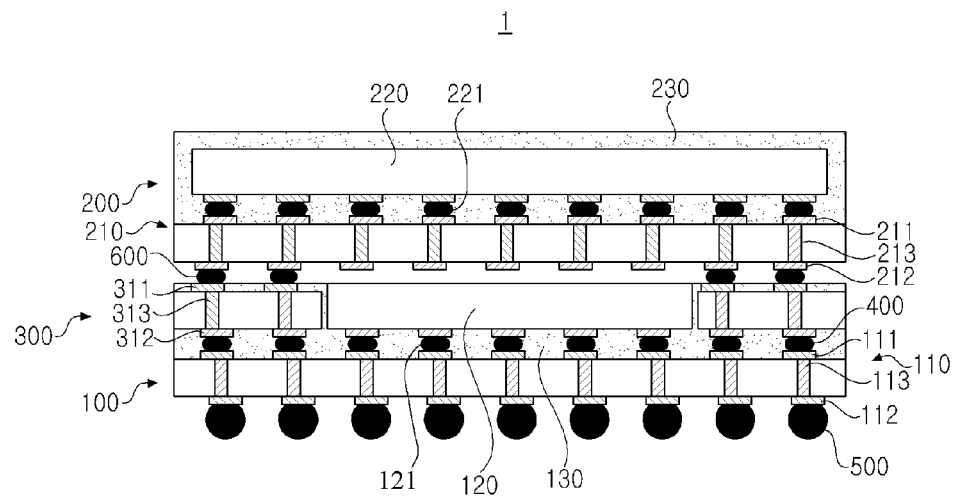
FIG. 2 is a cross-sectional view showing the structure of a stacked integrated circuit package according to an exemplary embodiment of the present invention.

FIG. 2 is a cross-sectional view showing the structure of a stacked integrated circuit package according to an exemplary embodiment of the present invention.

Figure 3:
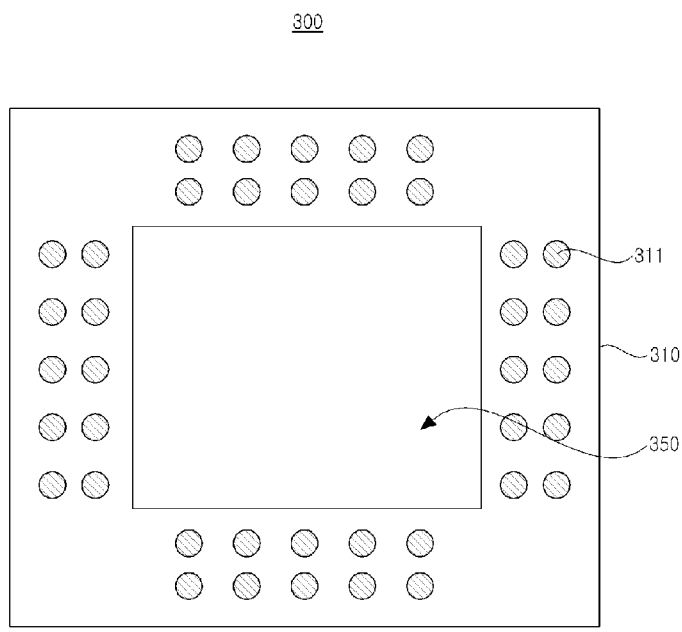
FIG. 3 is a plan view showing the configuration of an interposer according to an embodiment of the present invention.

FIG. 3 is a plan view showing the configuration of an interposer according to an embodiment of the present invention.

FIGS. 4A to 4F are cross-sectional views illustrating the processes of manufacturing a stacked integrated circuit package according to one embodiment of the present invention.

Referring to FIG. 2, a stacked integrated circuit package of the illustrated embodiment includes a lower (first) integrated circuit package 100, an upper (second) integrated circuit package 200 stacked on the lower integrated circuit package 100, and an interposer 300 interposed between the lower integrated circuit package 100 and the upper integrated circuit package 200. The stacked integrated circuit package further includes first to third solder bumps 400, 500 and 600 formed between the interposer 300 and the lower integrated circuit package 100 or the upper integrated circuit package 200 and on the bottom surface of the lower integrated circuit package 100.

The lower integrated circuit package 100 includes a first substrate 110, a first semiconductor chip 120, and a first molding portion 130.

The first substrate 110 includes a wire terminal 111 formed on the upper surface (one surface) of the first substrate 110, an external terminal 112 formed on the lower surface (the other surface) of the first substrate 110 to be connected to an external device via the solder ball 400, and a via contact 113 formed through the first substrate 110 to connect the wire terminal 111 to the external terminal 112. The first substrate 110 may further include a solder ball pad (not shown) on the upper surface.

The first semiconductor chip 120 is flip-chip bonded, via the solder balls 121, to the wire terminals 111 formed on the upper surface of the first substrate 110. Here, the first semiconductor chip 120 is flip-chip bonded to the first substrate 110, facing downward. Thereby, the first semiconductor chip 120 is electrically connected to the wire terminals 111 of the first substrate 110 via the solder balls 121 formed on the first semiconductor chip 120.

The first molding portion 130, which is a film assisted mold (FAM), is formed such that the upper surface of the first semiconductor chip 120 is exposed.

The upper integrated circuit package 200 includes a second substrate 210, a second semiconductor 220, and a second molding portion 230.

The second substrate 210 includes a wire terminal 211 formed on the upper surface (one surface) of the second substrate 210, an external terminal 212 formed on the lower surface (the other surface) of the second substrate 210 to be connected to an external device via the interposer 300, and a via contact 213 formed through the second substrate 210 to connect the wire terminal 211 to the external terminal 212.

The second semiconductor 220 is flip-chip bonded, via the solder balls 221, to the wire terminal 211 formed on the upper surface of the second substrate 210. Here, the second semiconductor 220 is electrically connected, via the solder balls 221 formed on the second substrate 210, to the wire terminals 211 of the second substrate 210, facing downward.

The second molding portion 230 is formed over the entire upper surfaces of the second semiconductor 220 and the second substrate 210. The second molding portion 230 may be formed of a selected one of, for example, epoxy resin, silicone resin and equivalents thereof. Here, the second molding portion 230 further includes an underfill between the second semiconductor 220 and the second substrate 210.

The interposer 300 is provided with an opening 350 to accommodate a semiconductor chip, as shown in FIG. 3. In the illustrated embodiment, the opening 350 is provided to accommodate the first semiconductor chip 120 and formed to have a larger size than the first semiconductor chip 120 to allow the encapsulant to fill the space between the first semiconductor chip 120 and the opening 350. The opening 350 is preferably formed at the center of the interposer 300.

The interposer 300 may have the same layer structure as that of the first substrate 110 or the second substrate 210. That is, the interposer 300 may include wire terminals 311 and 312 formed on the upper and lower surfaces of the interposer substrate 310, and via contacts 313 connecting the wire terminals 311 and 312 to each other. In addition, the interposer 300 may be formed of a material having a coefficient of thermal expansion similar to that of the first substrate 110 or the second substrate 210 to reduce warpage occurring due to differences in coefficients of thermal expansion between the substrate, semiconductor chip and molding portion during a high temperature reflow process.

The first solder bumps 400 are attached to the wire terminals 312 formed on the lower surface of the interposer 300 to be electrically connected to the substrate of the lower integrated circuit package, i.e., the first substrate.

The third solder bumps 600 are attached to the external terminals 212 formed on the bottom surface of the substrate of the upper integrated circuit package, i.e., the second substrate 210 to allow the lower integrated circuit package 100 and the upper integrated circuit package 200 to be connected to each other via the third solder bumps 600.

The second solder bumps 500 are attached to the external terminals 112 formed on the bottom surface of the first substrate 110 to electrically connect a POP integrated circuit package formed by stacking the upper integrated circuit package on the lower integrated circuit package to an external device (not shown) or substrate.

The size, shape and arrangement of the first to third solder bumps 400, 500 and 600 are not specifically limited, but can be properly designed as necessary.

As described above, the interposer in the illustrated embodiment is interposed between the lower integrated circuit package and the upper integrated circuit package. Thereby, rewiring of the upper integrated circuit package and increase in the number of I/O terminals are made possible.

In addition, according to the illustrated embodiment, the upper surface of the semiconductor chip of the lower integrated circuit package is exposed, and molding is performed on the interposer and the entire substrate of the lower integrated circuit package. Thereby, heat dissipation can be improved and high temperature warpage can be reduced.

FIGS. 4A to 4F are cross-sectional views illustrating the processes of manufacturing a stacked integrated circuit package according to one embodiment of the present invention. A method for manufacturing a stacked integrated circuit package according to the illustrated embodiment is described below with reference to FIGS. 4A to 4F.

Figure 4A:
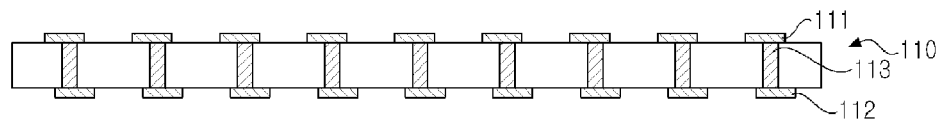
FIGS. 4A to 4F are cross-sectional views illustrating the processes of manufacturing a stacked integrated circuit package according to one embodiment of the present invention.

As shown in FIG. 4A, a first substrate 110 provided with wire terminals 111 arranged on the upper surface, external terminals 112 arranged on the lower surface, and via contacts 113 connecting the wire terminal 111 to the external terminal 112 is first prepared.

Figure 4B:
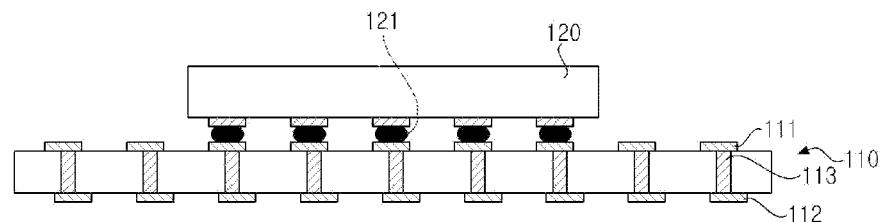

Next, as shown in FIG. 4B, a semiconductor chip 120 is flip-chip bonded to the wire terminal 111 of the first substrate 110 using the solder balls 121.

Figure 4C:
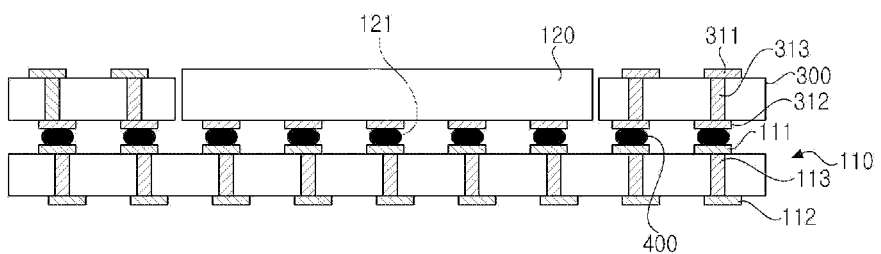

Next, as shown in FIG. 4C, the interposer 300 is attached to the first substrate 110. At this time, the interposer 300 is disposed such that the first semiconductor chip 120 is accommodated in the opening of the interposer 300. Then, the interposer 300 is attached to the wire terminals 111 of the first substrate 110 using the first solder bumps 400.

Figure 4D:
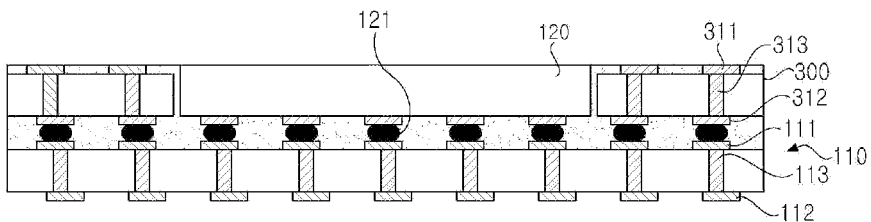

Next, as shown in FIG. 4D, the space between the first semiconductor chip 120 and the first substrate 110, between the first semiconductor chip 120 and the interposer 300, and between the first semiconductor substrate 110 and the interposer 300 is sealed with an encapsulant to form the first molding portion 130. Here, the first molding portion 130 is formed in the process of film assisted molding (FAM) such that the upper surface of the first semiconductor chip 120 is exposed. By forming the molding portion through the FAM process, the space between the first substrate 110 and the first semiconductor chip 120 can be sealed with the encapsulant without separately performing the underfill process.

Figure 4E:
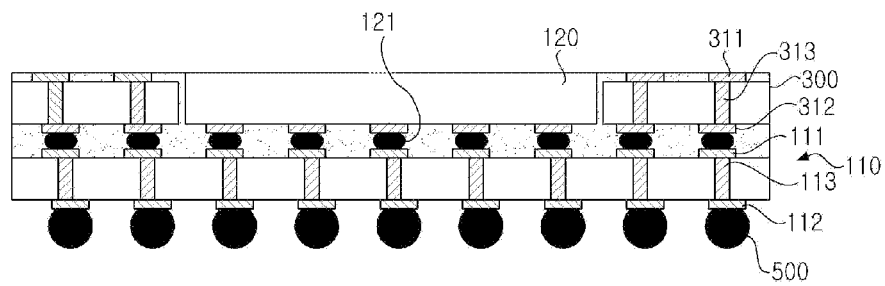

Next, as shown in FIG. 4E, second solder bumps 500 are formed on the external terminals 112 formed on the bottom surface of the first substrate 110.

Figure 4F:
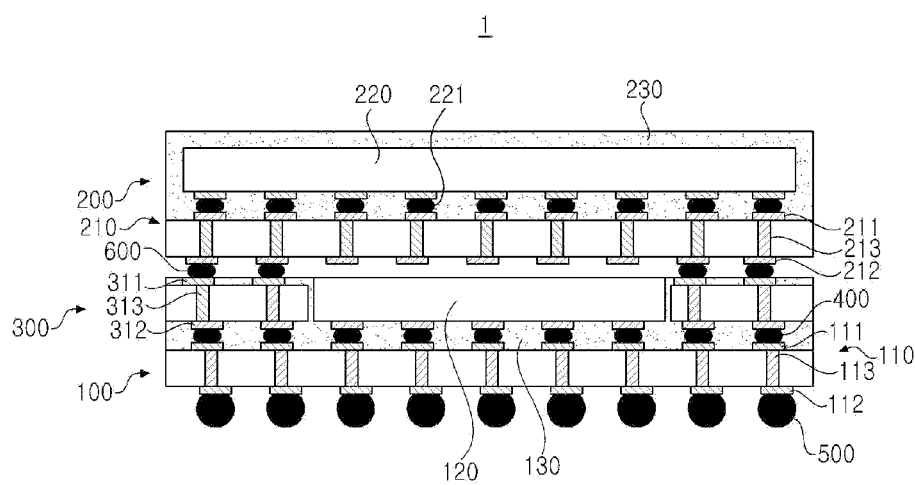

Next, as shown in FIG. 4F, the second integrated circuit package 200 is stacked on the first integrated circuit package 100 using the third solder bumps 600. Here, the second integrated circuit package 200 includes wire terminals 211, a second substrate 210 provided with external terminals 212 and via contacts 213, a second semiconductor 220 electrically connected to the wire terminals 211 of the second substrate 210 via solder balls 221, and a second molding portion 230 formed on the entire upper surfaces of the second semiconductor 220 and the second substrate 210. The wire terminals 311 of the interposer 300 are electrically connected to the external terminals 213 of the second substrate 210 via the third solder bumps 600.

In the above embodiment, attachment of the interposer is performed after the first semiconductor chip is attached to the first substrate. Alternatively, the interposer may first be stacked on the first substrate, and then the first semiconductor chip may be stacked such that the first semiconductor chip is accommodated in the opening of the interposer. In addition, a wire bonding structure may be formed in place of the flip chip bonding structure.

Figure 5:
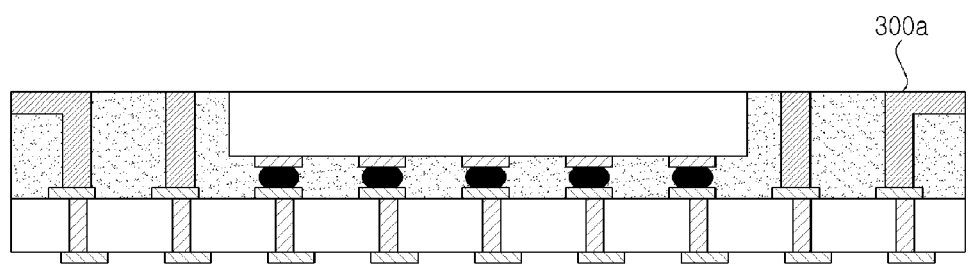
FIG. 5 is a cross-sectional view showing an interposer according to another embodiment of the present invention.

Further, as shown in FIG. 5, a lead frame 300a may be used as the interposer. In FIG. 5, other constituents except the lead frame 300a are the same as those of the lower integrated circuit package of FIG. 2, and thus a detailed description thereof will be omitted.

According to the illustrated embodiment as described above, the molding process is performed to form a molding portion on the semiconductor chip of the lower integrated circuit package after the interposer is interposed to position the semiconductor chip in the opening of the interposer semiconductor chip. Then, the upper integrated circuit package is mounted on the lower integrated circuit package, molding of which has been completed. Thereby, the laser machining process and underfill process, which take a large amount of time, are eliminated, and therefore process time can be reduced and manufacturing costs, in turn, can be reduced.

In addition, according to a stacked integrated circuit package and a method for manufacturing the same in one embodiment of the present invention, the semiconductor chip of the lower integrated circuit package is exposed, and therefore heat dissipation can be improved and high temperature warpage can be reduced.

As is apparent from the above description, according to a stacked integrated circuit package in an embodiment of the present invention, an interposer is first interposed to allow a semiconductor chip of a lower integrated circuit package to be positioned in the opening of the interposer, and then an upper integrated circuit package is attached to the interposer. Thereby, it is possible to perform rewiring through the interposer and increase the number of I/O terminals.

In addition, according to a method for manufacturing a stacked integrated circuit package in an embodiment of the present invention, the molding process is performed to form a molding portion on the semiconductor chip of the lower integrated circuit package after the interposer is interposed to position the semiconductor chip in the opening of the interposer semiconductor chip. Then, the upper integrated circuit package is mounted on the lower integrated circuit package, molding of which has been completed. Thereby, the laser machining process and underfill process, which take a large amount of time, are eliminated and therefore process time can be reduced and manufacturing costs, in turn, can be reduced.

In addition, according to embodiments of the present invention of a stacked integrated circuit package and a method for manufacturing the same, the semiconductor chip of the lower integrated circuit package is exposed, and therefore heat dissipation can be improved and high temperature warpage can be reduced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A stacked integrated circuit package comprising:
   a first integrated circuit package comprising a first substrate provided with a first circuit pattern, a first semiconductor chip mounted on the first substrate to be electrically connected to the first circuit pattern, and a first molding portion formed such that at least one surface of the first semiconductor chip is exposed;
   an interposer mounted on the first substrate to be electrically connected to the first circuit pattern of the first substrate by a first solder bump, the interposer being provided with an opening to accommodate the first semiconductor chip; and
   a second integrated circuit package stacked on the first integrated circuit package and the interposer and electrically connected to the interposer by a second solder bump, the second integrated circuit package comprising a second substrate provided with a second circuit pattern, a second semiconductor chip mounted on the second substrate to be electrically connected to the second circuit pattern, and a second molding portion formed to completely seal one surface of the second semiconductor chip and the second substrate.

2. The stacked integrated circuit package according to claim 1, wherein at least one of the first semiconductor chip and the second semiconductor chip is mounted on the first substrate or the second substrate through a flip chip bonding structure.

3. The stacked integrated circuit package according to claim 1, wherein at least one of the first semiconductor chip and the second semiconductor chip is mounted on the first substrate or the second substrate through a wire bonding structure.

4. The stacked integrated circuit package according to claim 1, wherein the interposer is provided with a layer structure identical to a layer structure of at least one of the first substrate and the second substrate.

5. The stacked integrated circuit package according to claim 4, wherein the interposer comprises:
   an insulating substrate;
   a third circuit pattern formed on an upper surface of the insulating substrate and a fourth circuit pattern formed on a lower surface of the insulating substrate; and
   a via contact provided to electrically connect the third circuit pattern and the fourth circuit pattern.

6. The stacked integrated circuit package according to claim 1, wherein the interposer is provided with a lead frame or a layer structure allowing interconnection.

7. A method for manufacturing a stacked integrated circuit package comprising the steps of:
   mounting a first semiconductor chip on a first substrate provided with a circuit pattern;
   mounting an interposer on the first substrate, the interposer being provided with an opening to accommodate the first semiconductor chip;
   filling a space between the first substrate and the first semiconductor chip, between the first substrate and the interposer and between the first semiconductor chip and the interposer with an encapsulant such that at least one surface of the first substrate is exposed; and
   stacking, on the first semiconductor chip, an integrated circuit package including a second substrate and a second semiconductor chip mounted on the second substrate, such that the second semiconductor chip is electrically connected to the first semiconductor chip via the interposer.

8. The method according to claim 7, wherein at least one of the first semiconductor chip and the second semiconductor chip is mounted on the first substrate or the second substrate in a flip chip bonding process.

9. The method according to claim 7, wherein at least one of the first semiconductor chip and the second semiconductor chip is mounted on the first substrate or the second substrate in a wire bonding process.

10. The method according to claim 7, wherein the step of filling includes a film assisted molding (FAM) process.

* * * * *